(12) United States Patent
Venugopal et al.

(10) Patent No.: US 10,581,412 B1
(45) Date of Patent: Mar. 3, 2020

(54) PULSED LEVEL SHIFTER CIRCUITRY

(71) Applicant: Apple Inc., Cupertino, CA (US)

(72) Inventors: Vivekanandan Venugopal, San Jose, CA (US); Ajay Bhatia, Saratoga, CA (US); Wenhao Li, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/369,072

(22) Filed: Mar. 29, 2019

(51) Int. Cl.
*H03K 3/037* (2006.01)
*H03K 19/0185* (2006.01)

(52) U.S. Cl.
CPC ..... *H03K 3/037* (2013.01); *H03K 19/018521* (2013.01)

(58) Field of Classification Search
None
See application file for complete search history.

(56) References Cited

U.S. PATENT DOCUMENTS

| 6,970,018 B2 | 11/2005 | Markovic et al. |
| 7,196,699 B1 * | 3/2007 | Kubota ................ G09G 3/3677 345/100 |
| 8,520,428 B2 | 8/2013 | Helder et al. |
| 9,036,446 B2 | 5/2015 | Terzioglu et al. |
| 10,256,796 B2 * | 4/2019 | Hsin .................. H03K 3/35625 |

* cited by examiner

*Primary Examiner* — Jeffery S Zweizig
(74) *Attorney, Agent, or Firm* — Kowert, Hood, Munyon, Rankin & Goetzel, P.C.

(57) ABSTRACT

Techniques are disclosed relating to level-shifting circuitry and time borrowing across voltage domains. In disclosed embodiments, an apparatus includes pulse circuitry, latch circuitry, pull circuitry, and feedback circuitry. The pulse circuitry is configured to generate a pulse signal in response to an active clock edge. The latch circuitry is configured to store a value of an input signal, where the input signal has a first voltage level. The pull circuitry is configured to drive, during the pulse signal, an output of the latch circuitry to match a logical value of the input signal at a second, different voltage level. This may allow the input signal to change during the pulse, enabling time borrowing. The feedback circuitry is configured to maintain the output of the latch circuitry at the second voltage level after the pulse signal.

20 Claims, 9 Drawing Sheets

PULSED LEVEL SHIFTER CIRCUITRY

BACKGROUND

Technical Field

This disclosure relates generally to voltage level-shifting circuitry and more particularly to level-shifting circuitry with time borrowing.

Description of the Related Art

Time borrowing is a circuit technique in which edge-to-edge timing requirements are relaxed such that a longer combinational path can borrow some time from a shorter path in a subsequent stage. For example, an output signal from first circuitry borrowing from second circuitry may arrive after an active clock edge, but still be properly received by the second circuitry.

Circuits often include different voltage domains, with level-shifting circuitry between the domains. Sense amplifiers are one example of level shifting circuitry. For example, a sense amplifier may receive an input value at a relatively lower voltage from a memory cell and output the value at a relatively higher voltage to other circuitry.

Traditional circuitry does not allow time borrowing across voltage domains.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "level shifting flip flop" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

Further, as used herein, the terms "first," "second," "third," etc. do not necessarily imply an ordering (e.g., temporal) between elements. For example, a referring to a "first" graphics operation and a "second" graphics operation does not imply an ordering of the graphics operation, absent additional language constraining the temporal relationship between these operations. In short, references such as "first," "second," etc. are used as labels for ease of reference in the description and the appended claims.

DETAILED DESCRIPTION

Overview of Time Borrowing Across Voltage Domains

In disclosed embodiments, level-shifting circuitry is configured to operate based on an input signal at a first voltage level and generate an output at a second voltage level while allowing time borrowing. For example, pulse circuitry may generate a pulse signal beginning at an active clock edge, and the input to the level-shifting circuitry may be allowed to change during the pulse. Thus, the circuitry may transparently pass and level shift the input during the pulse, which may allow upstream circuitry to borrow time by changing its output during the pulse.

In some embodiments, one set of circuitry drives the output of the level-shifter during the clock pulse and another set of circuitry maintains the output of the level-shifter after the clock pulse. Examples of circuitry discussed herein include flip-flops and static to dynamic converters (SDCs), but the disclosed techniques are not limited to these specific circuit implementations.

Figure 1:
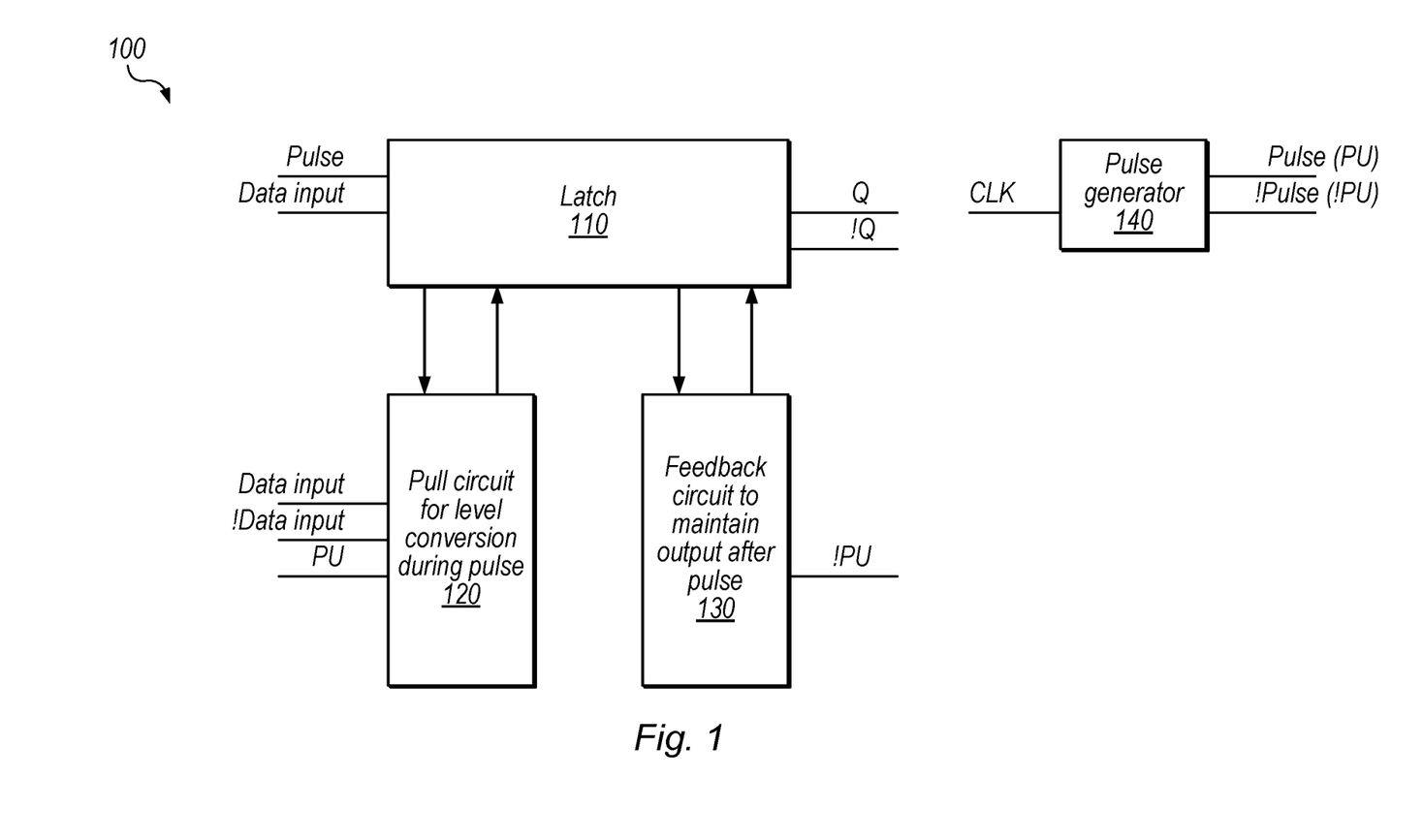
FIG. 1 is a block diagram illustrating example level shifting circuitry that includes pull circuitry and feedback circuitry, according to some embodiments.

FIG. 1 is a block diagram illustrating an example latch-based level shifter, according to some embodiments. In the illustrated embodiment, circuitry 100 includes latch 110, pull circuit 120, feedback circuit 130, and pulse generator 140.

Pulse generator 140, in the illustrated embodiment, is configured to generate a pulse signal PU and its inverse !PU based on an input clock signal CLK. In some embodiments, the pulse signal is high for an interval after an active clock edge and then remains low until the next active clock edge. An example circuit implementation for pulse generator 140 is discussed in detail below with reference to FIG. 2A.

Latch 110, in some embodiments, is a cross-coupled D-latch that is configured to hold its current value when the pulse signal is low (e.g., when enabled by the feedback circuit 130, as discussed in detail below). In the illustrated embodiment, latch 110 outputs both an output signal Q and its inverse !Q. In other embodiments, latch 110 may generate a single output. In some embodiments, the data input is in a different voltage domain than the data output Q.

Pull circuit 120, in the illustrated embodiment, is configured to perform level conversion to drive the output signal Q to a different voltage level during the pulse. In some embodiments, this allows the data input signal to change during the pulse (e.g., to enable time borrowing by an upstream path) and still be properly output and stored. In the illustrated embodiment, pull circuit 120 operates based on the data input, the inverse of the data input, and the pulse signal. In detailed embodiments discussed below, pull circuit 120 is a pull-down circuit, but circuit 120 may be a pull-up circuit in other embodiments.

Feedback circuit 130, in the illustrated embodiment, is configured to maintain the level conversion after the pulse signal, e.g., by enabling cross-coupled circuitry of latch 110 such that it stores the input signal. After the pulse, the pull circuit 120 may be tri-stated such that level shifting does not occur after the pulse. In the illustrated embodiment, feedback circuit 130 operates based on the inverse of the pulse signal. In some embodiments such as SDC implementations, feedback circuit 130 may also operate based on the CLK signal.

Note that various specific circuit examples discussed herein are included for purposes of illustration but are not intended to limit the scope of the present disclosure. As one example, complementary metal oxide (CMOS) transistor technology is shown in certain figures, but any of various other transistor technologies may be used. Similarly, various polarities of signals are shown but may be represented using other polarities in other embodiments. As one particular example, pull-up circuitry may be replaced with pull-down circuitry and controlled by an inverse of similar input signals. Similarly, the active clock edge may vary (e.g., may be the rising edge, falling edge, or both edges may be active).

Figure 2A:
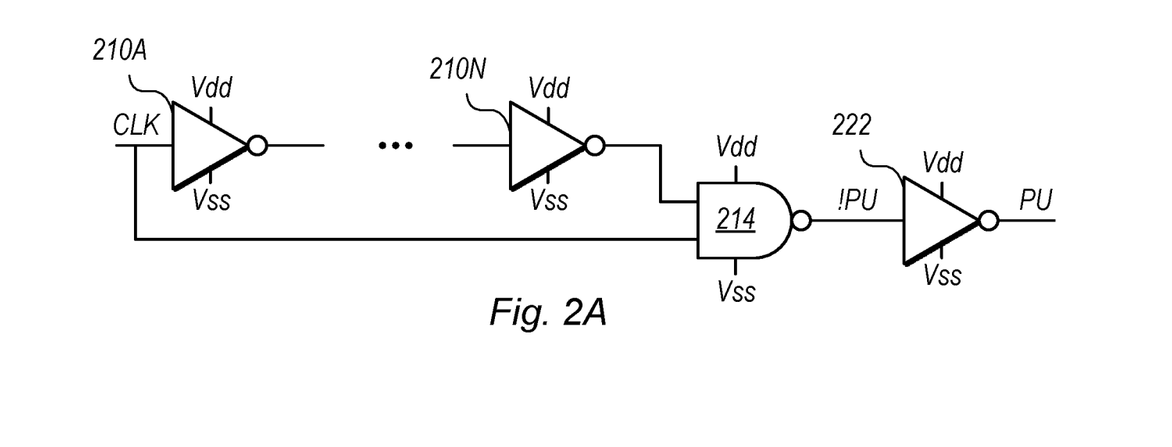
FIG. 2A is a circuit diagram illustrating example pulse circuitry, according to some embodiments.
Figure 2B:
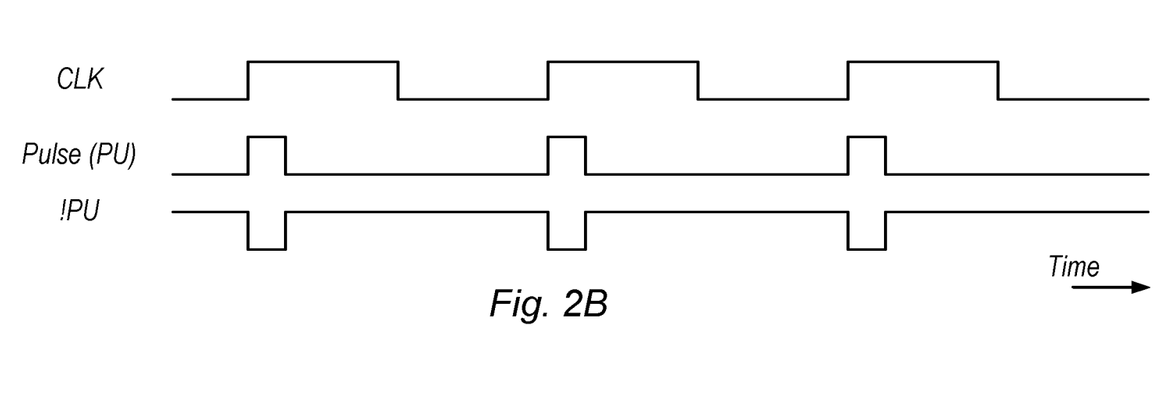
FIG. 2B is a timing diagram illustrating example clock and pulse signals, according to some embodiments.

FIG. 2A is a block diagram illustrating an example pulse generator circuit, according to some embodiments. In the illustrated embodiment, the pulse circuit includes multiple inverters 210A-210N, NAND gate 214, and inverter 222. FIG. 2B is a timing diagram illustrating example pulse signals generated by the circuitry of FIG. 2A, according to some embodiments. In the illustrated embodiment, the rising clock edge is the active edge.

As shown, in response to the clock transitioning from low to high, NAND gate 214 generates an inverted pulse corresponding to the delay imposed by inverters 210A-210N. As discussed above, in some embodiments, the length of the pulse corresponds to the duration of a window in which time borrowing is allowed to occur.

Example Level Shifting Flip-Flop that Allows Time Borrowing

Figure 3A:
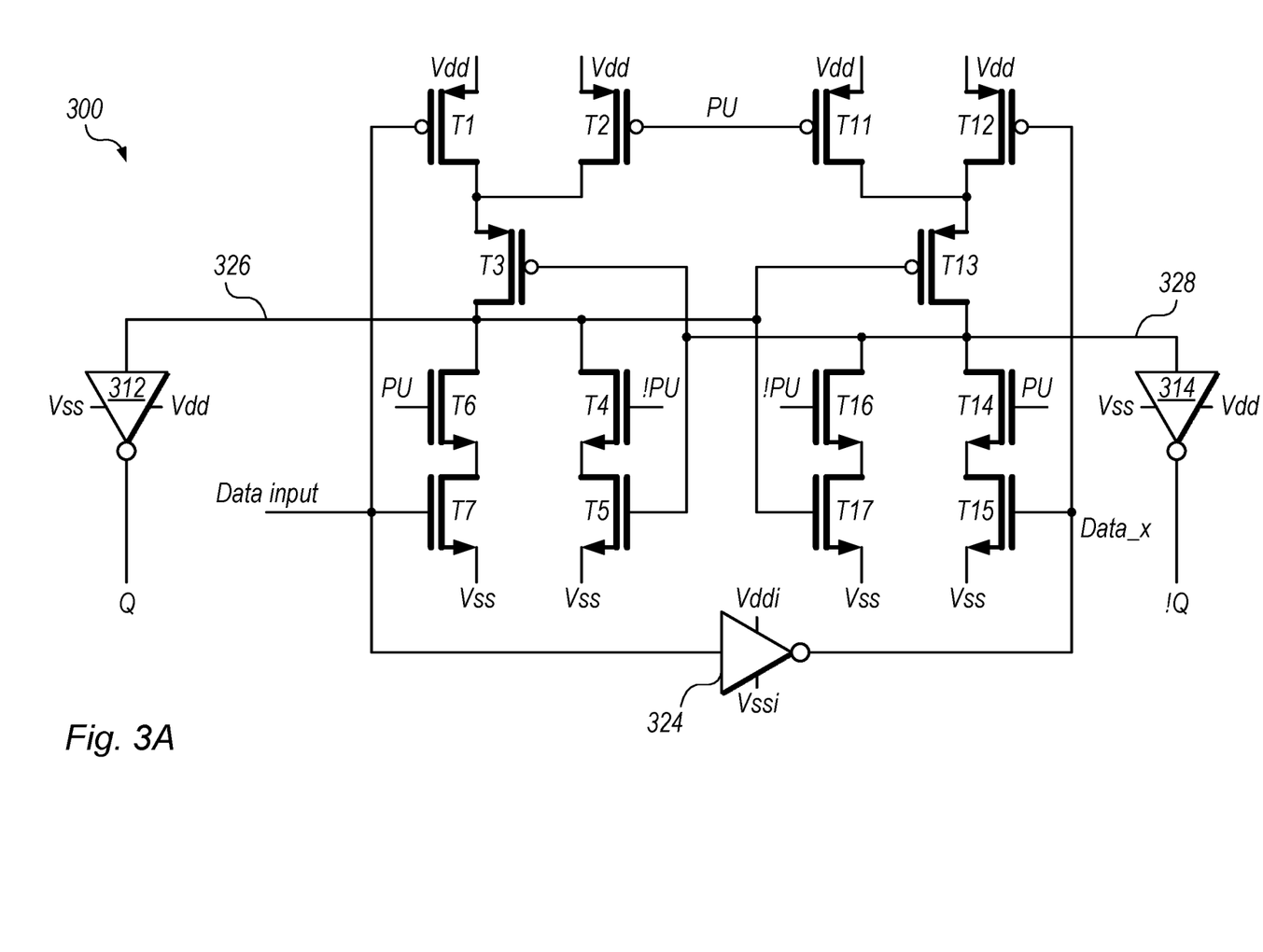
FIGS. 3A-3B are transistor-level diagrams illustrating example level-shifting flip-flops, according to some embodiments.

FIG. 3A is a circuit diagram illustrating an example level-shifting flip-flop circuit 300 that allows time borrowing, according to some embodiments. In the illustrated embodiment, circuit 300 includes transistors T1-T17 and inverters 312, 314, and 324. Circuit 300 receives a data input, PU, and !PU, and generates outputs Q and !Q. As is well-understood by those skilled in the art, an edge-triggered flip flop typically stores the input value in response to an active clock edge and outputs that value until the next active clock edge.

In the illustrated embodiment, the data input and inverter 324 are in the input voltage domain corresponding to $V_{ddi}$ and $V_{ssi}$ while the remaining circuitry is in the output voltage domain corresponding to $V_{dd}$ and $V_{ss}$. The different domains may have different supply voltages, reference voltages, or both. Note that $V_{dd}$ and $V_{ss}$ represent a supply voltage and a reference voltage respectively, with $V_{dd}$ typically having a larger voltage than $V_{ss}$ (which may be a ground).

Transistors T6, T7, T14, and T15 represent an example implementation of pull circuit 120 while transistors T2, T4, T11, and T16 represent an example implementation of feedback circuit 130, which may operate in conjunction with the latch. Remaining transistors may operate according to a well-understood cross-coupled latch implementation, when enabled by the feedback circuitry.

During the pulse signal, in the illustrated embodiment, transistors T6 and T14 are on and transistors T2, T11, T4, and T16 are off. Note that the terms "on" and "off" are used herein to indicate conducting and non-conducting states respectively, in disclosed embodiments in which transistors are used as three-terminal switches with a control terminal that controls whether the transistor conducts between the two other terminals. In this situation, if the data input is high, node 326 is driven low by transistors T6 and T7 (providing the correct high output at Q via inverter 312) while node 328 is driven high by transistors T12 and T13. If the data input changes during the pulse, the change is propagated to nodes 326 and 328 via one of the pull-down stacks (e.g., T6 and T7 or T14 and T15).

When the pulse signal ends, transistors T6 and T14 are turned off and transistors T2, T11, T4, and T16 are turned on. In the illustrated embodiment, this de-couples the cross-coupled circuitry from the data input and enables feedback between nodes 326 and 328 by properly connecting the cross-coupled circuitry to $V_{dd}$ and $V_{ss}$. In these embodiments, the cross-coupled latch maintains the output signals in the output domain after expiration of the pulse. For example, if node 326 is high, it pushes node 328 low via transistors T17 and T16 and is similarly pushed high by node 328 via transistors T2 and T3, maintaining the stored value. After the pulse, the level-shifting pull circuitry (e.g., transistors T7 and T15) is tri-stated (e.g., by transistors T6 and T14 being turned off) and the feedback circuitry maintains the outputs at their current level.

In the illustrated embodiment, circuitry 300 implements an edge-triggered flip-flop that allows the data input to change late, during the pulse, which may allow upstream circuitry to time borrow from circuitry 300.

Figure 3B:
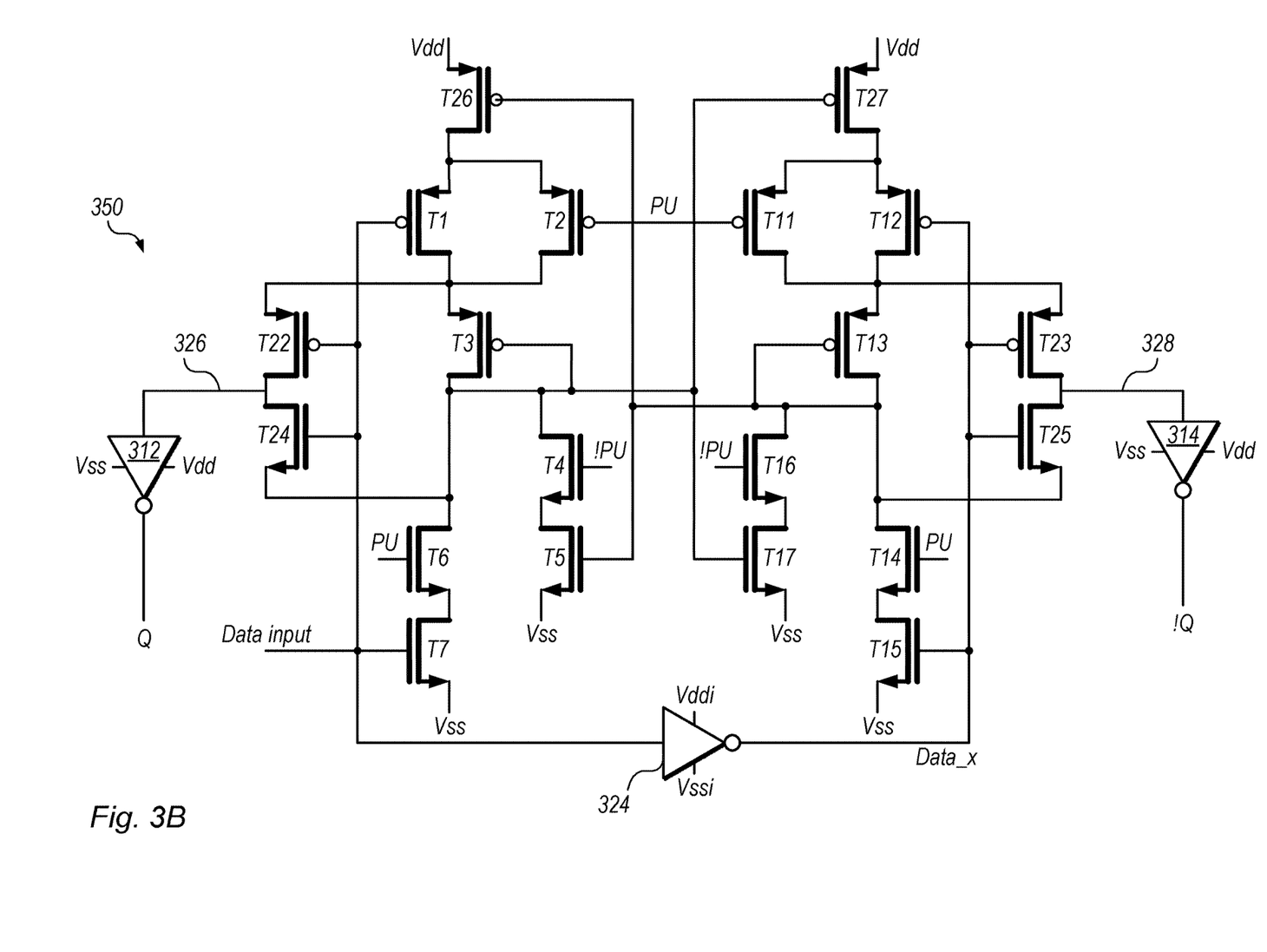

FIG. 3B is a circuit diagram illustrating an example wide range level shifting flip flop circuit 350 that allows time borrowing, according to some embodiments. In FIG. 3B, elements numbered similarly to elements of FIG. 3A may function as described above with reference to FIG. 3A. In the illustrated embodiment, FIG. 3B also includes four additional transistors T22-T27.

In the illustrated embodiment, in contrast to FIG. 3A, transistors T3 and T13 are drain-coupled rather than being controlled by the cross-coupling. Transistors T26 and T27 are controlled by the cross-coupling. Further, transistors T22 and T24 and T23 and T25 drive nodes 328 and 328 based on the data input and voltages at other circuit nodes. In various embodiments, the disclosed circuitry of FIG. 3B may allow a wider range of level shifting, relative to the circuitry of FIG. 3A.

Example Level Shifting SDC that Allows Time Borrowing

Figure 4A:
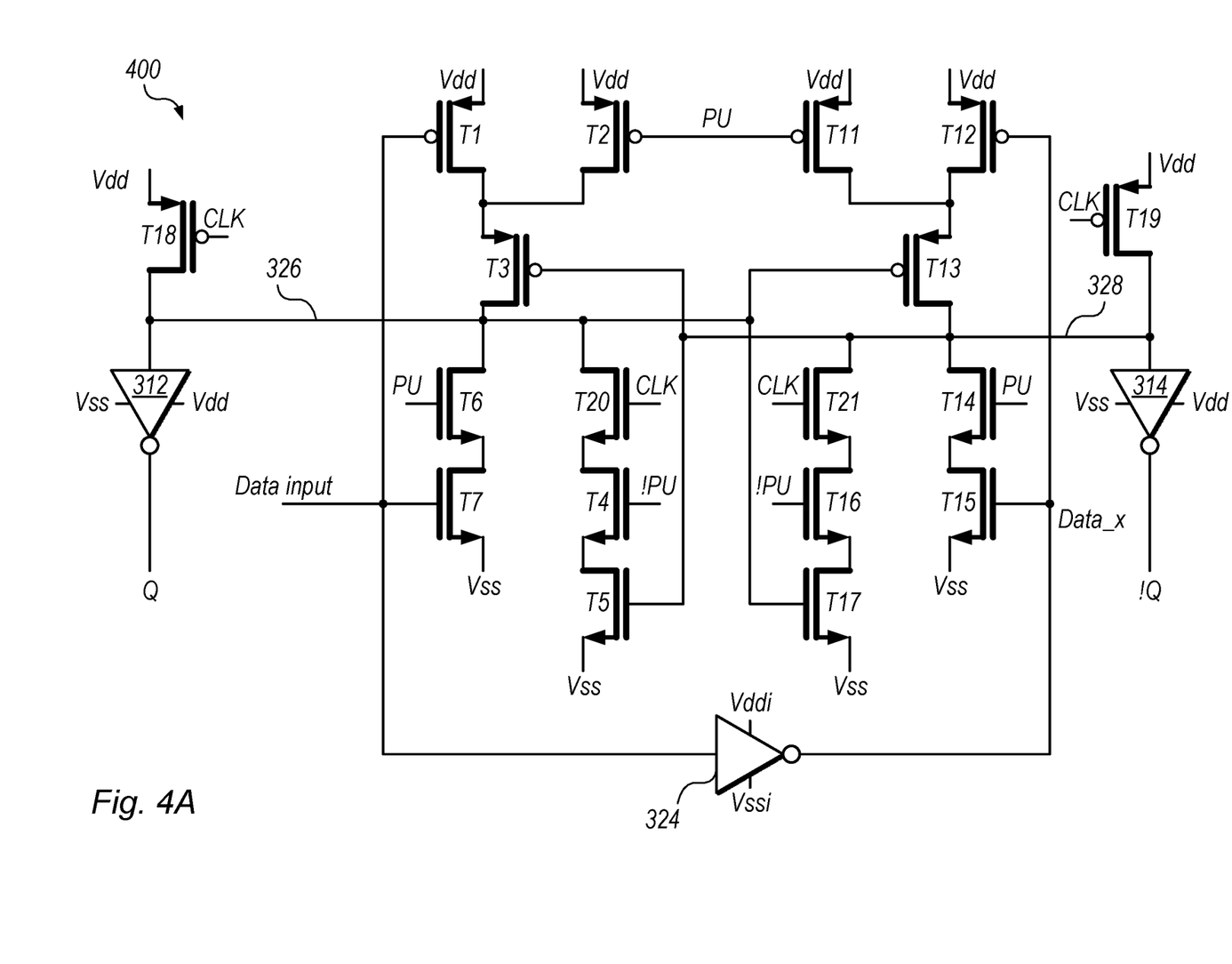
FIGS. 4A-4B are transistor-level diagrams illustrating example static to dynamic converters (SDCs), according to some embodiments.

FIG. 4A is a circuit diagram illustrating an example level shifting SDC circuit 400 that allows time borrowing, according to some embodiments. In the illustrated embodiment, circuit 400 includes transistors T1-T21 and inverters 312, 314, and 324. Circuit 400 receives a data input, CLK, PU, and !PU, and generates output Q and !Q. As is well-understood by those skilled in the art, an SDC typically passes the data input through to the Q terminal when the clock is high and outputs a low signal on the Q terminal when the clock is low. Similarly, if a complimentary output such as !Q is implemented, the SDC inverts the data input on the !Q terminal when the clock is high but outputs a low signal on the !Q terminal when the clock is low. This converts a static data input signal into a dynamically encoded output, in some embodiments.

In FIG. 4A, elements numbered similarly to elements of FIG. 3A may function as described above with reference to FIG. 3A. In the illustrated embodiment, FIG. 4A also includes four additional transistors T18-T21. Transistors T18 and T19, in the illustrated embodiment, drive the Q and !Q outputs low when the clock is low. Transistors T20 and T21 are off when the clock signal is low, disabling the cross-coupled feedback. In the illustrated embodiment, the pull circuitry drives the outputs during the pulse, the feedback circuitry maintains the outputs from the end of the pulse to the next falling clock edge, and transistors T18 and T19 drive the outputs until the next rising clock edge and pulse. In the illustrated embodiment, circuitry 400 implements an SDC that allows the data input to change late, during the pulse, and still affect the dynamic output.

Figure 4B:
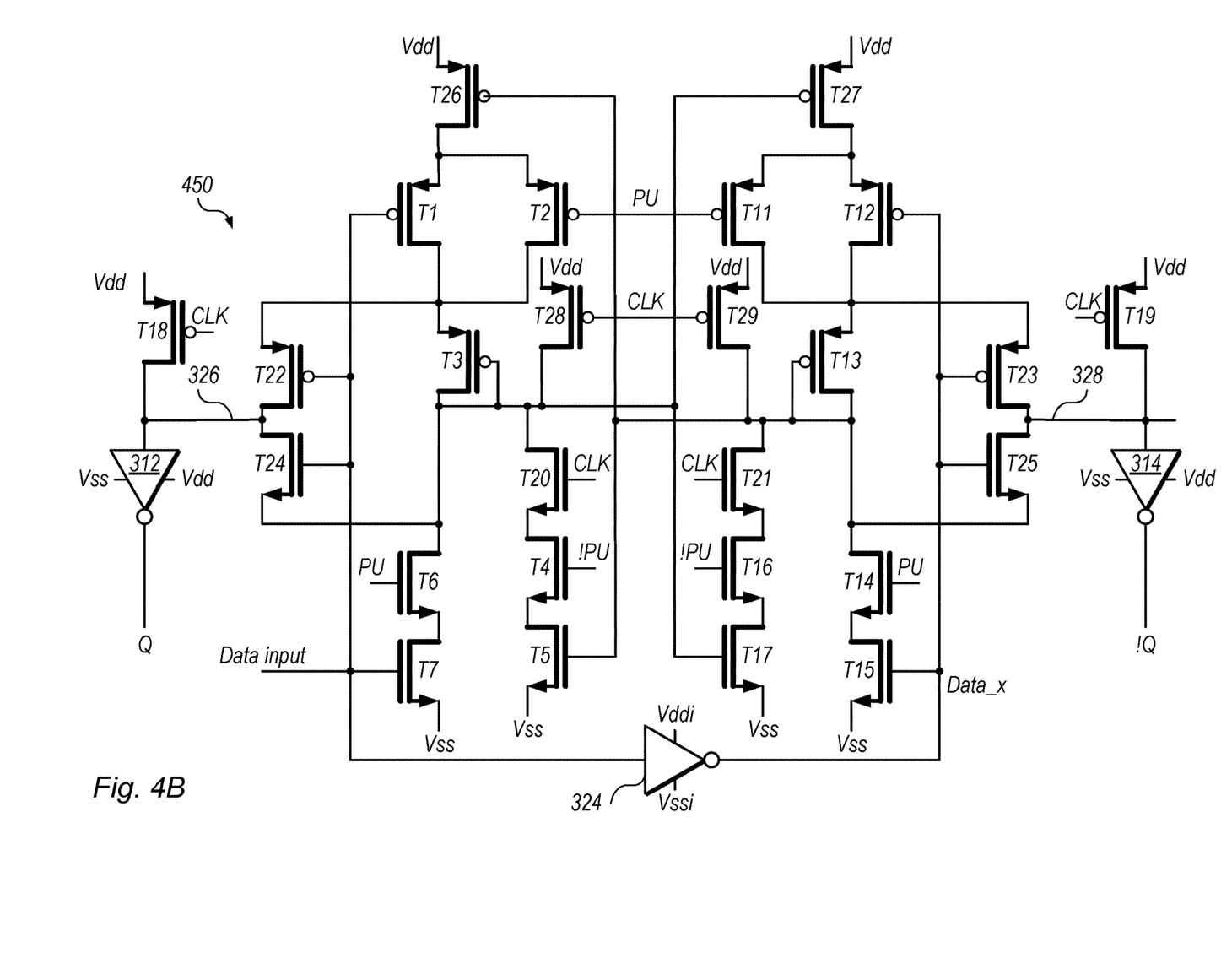

FIG. 4B is a circuit diagram illustrating an example wide range level shifting SDC circuit 450 that allows time borrowing, according to some embodiments. In FIG. 4B, elements numbered similarly to elements of FIGS. 3A, 3B, and 4A may function as described above with reference to those figures. In the illustrated embodiment, FIG. 4B also includes four additional transistors T28 and T29.

In the illustrated embodiment, in contrast to FIG. 4A, transistors T3 and T13 are drain-coupled rather than being controlled by the cross-coupling. Transistors T26 and T27 are controlled by the cross-coupling. Further, transistors T22 and T24 and T23 and T25 drive nodes 328 and 328 based on the data input and voltages at other circuit nodes.

In the illustrated embodiment, transistors T28 and T29 are configured to drive the outputs Q and Q! low when the clock signal is low. In various embodiments, the disclosed circuitry of FIG. 4B may allow a wider range of level shifting, relative to the circuitry of FIG. 4A.

In some embodiments, level-shifting circuitry may be implemented with a single output (e.g., with the Q output but not the !Q output). This may allow additional time borrowing on a certain data transition (e.g., the 0 to 1 data transition). For example, in FIG. 4A the inverter 314 may be replaced with a transistor coupled between node 328 and $V_{ss}$ and controlled by the inverse of the CLK signal, in these embodiments. Similarly, any of the various circuits discussed herein with complementary outputs may be implemented with a single output.

Example Method

Figure 5:
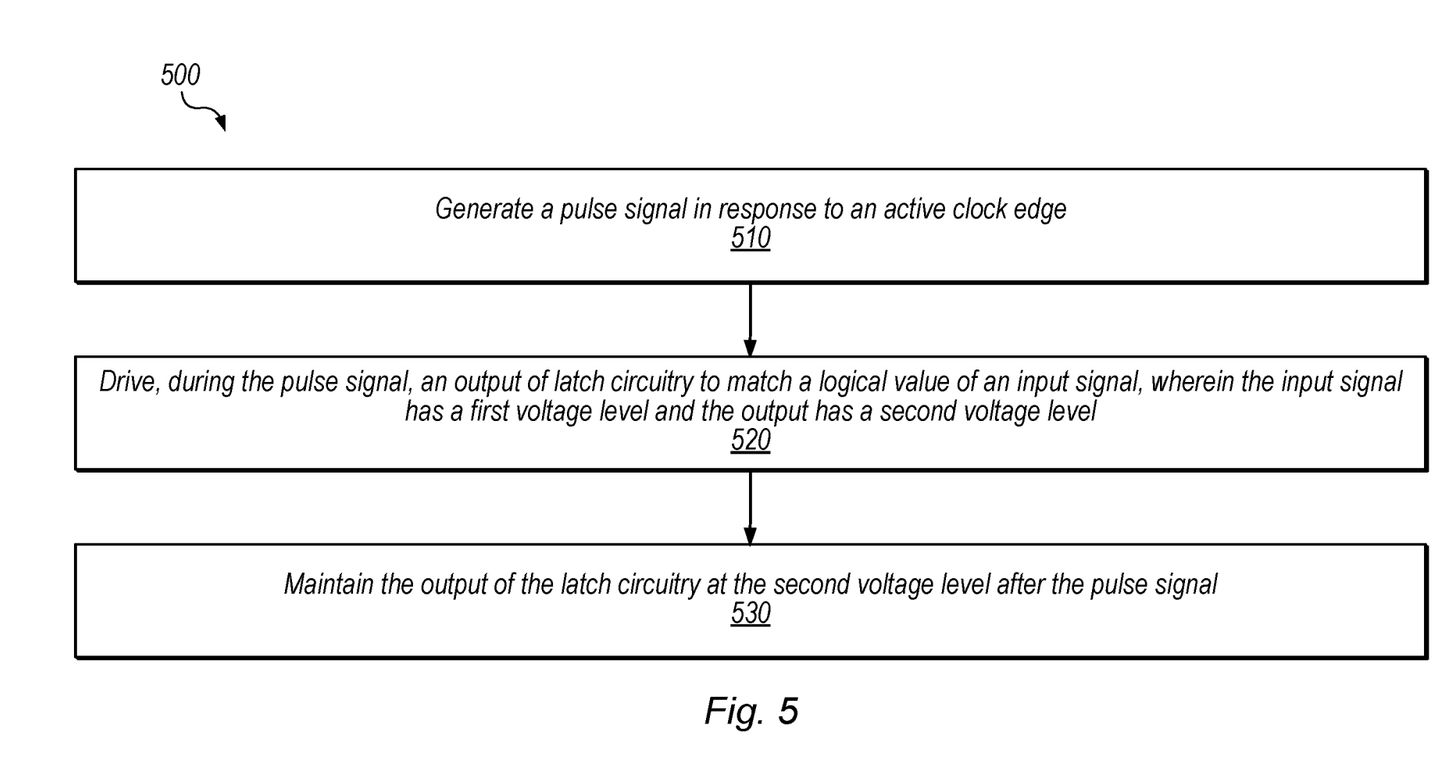
FIG. 5 is a flow diagram illustrating an example method for operating level-shifting circuitry, according to some embodiments.

FIG. 5 is a flow diagram illustrating a method 500 for operating a pulsed level shifting circuit, according to some embodiments. The method shown in FIG. 5 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 510, in the illustrated embodiment, pulse circuitry generates a pulse signal in response to an active clock edge. The circuitry of FIG. 2A is one example of pulse circuitry. The active clock edge may be a rising edge of a clock signal or a falling edge of the clock signal. The pulse may begin at the active clock edge and end before a next clock edge or before a next active clock edge.

At 520, in the illustrated embodiment, pull circuitry drives, during the pulse signal, an output of latch circuitry to match a logical value of an input signal, where the input signal has a first voltage level and the output has a second voltage level. In some embodiments, the pull circuitry includes a transistor stack coupled between the output of the latch circuitry and a source voltage or reference voltage (e.g., $V_{dd}$ or $V_{ss}$). The transistor stack may include a first transistor controlled by the pulse signal (which includes being controlled by an inverse of the pulse signal) and a second transistor controlled by the input signal (which includes being controlled by an inverse of the pulse signal).

At 530, in the illustrated embodiment, feedback circuitry maintains the output of the latch circuitry at the second voltage level after the pulse signal. In some embodiments, this includes enabling cross-coupled circuitry of the latch circuitry after the pulse signal (e.g., by turning on transistors T2, T11, T4, and T16). In some embodiments, the latch circuitry stores a value of the input signal, e.g., when enabled by the feedback circuitry.

In some embodiments, the method implements flip-flop functionality with level shifting. In some embodiments, the method implements SDC functionality with level shifting. In some SDC embodiments, one or more transistors drive the output of the latch to a logical zero when the clock is low and disable at least a portion of the feedback circuitry when the clock is low.

In some embodiments, circuitry configured to generate the input signal at the first voltage level time borrows from the latch circuitry by changing the input signal after the active clock edge and during the pulse signal. In some embodiments, the pull circuitry changes the output of the latch circuitry during the pulse to match the change in the input signal.

In various embodiments, the disclosed techniques may allow time borrowing across voltage domains.

Example Device

Figure 6:
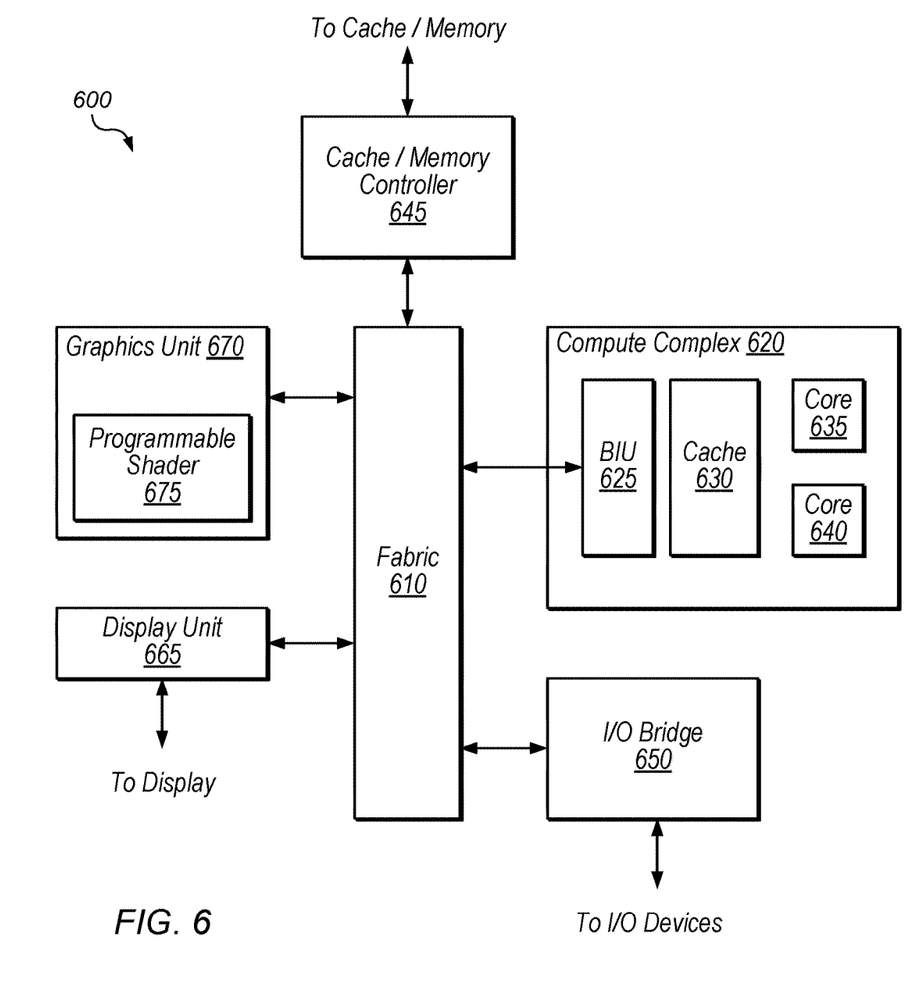
FIG. 6 is a block diagram illustrating an example computer-readable medium that stores circuit design information, according to some embodiments.

Referring now to FIG. 6, a block diagram illustrating an example embodiment of a device 600 is shown. In some embodiments, elements of device 600 may be included within a system on a chip. In some embodiments, device 600 may be included in a mobile device, which may be battery-powered. Therefore, power consumption by device 600 may be an important design consideration. In the illustrated embodiment, device 600 includes fabric 610, compute complex 620 input/output (I/O) bridge 650, cache/memory controller 645, graphics unit 670, and display unit 665. In some embodiments, device 600 may include other components (not shown) in addition to and/or in place of the illustrated components, such as video processor encoders and decoders, image processing or recognition elements, computer vision elements, etc.

The techniques disclosed herein may be utilized in various processors of various types of computing devices. For example, disclosed circuitry may be implemented in a memory controller, graphics unit, processor core, etc.

Fabric 610 may include various interconnects, buses, MUX's, controllers, etc., and may be configured to facilitate communication between various elements of device 600. In some embodiments, portions of fabric 610 may be configured to implement various different communication protocols. In other embodiments, fabric 610 may implement a single communication protocol and elements coupled to fabric 610 may convert from the single communication protocol to other communication protocols internally.

In the illustrated embodiment, compute complex 620 includes bus interface unit (BIU) 625, cache 630, and cores 635 and 640. In various embodiments, compute complex 620 may include various numbers of processors, processor cores and/or caches. For example, compute complex 620 may include 1, 2, or 4 processor cores, or any other suitable number. In one embodiment, cache 630 is a set associative L2 cache. In some embodiments, cores 635 and/or 640 may include internal instruction and/or data caches. In some embodiments, a coherency unit (not shown) in fabric 610, cache 630, or elsewhere in device 600 may be configured to maintain coherency between various caches of device 600. BIU 625 may be configured to manage communication between compute complex 620 and other elements of device 600. Processor cores such as cores 635 and 640 may be configured to execute instructions of a particular instruction set architecture (ISA) which may include operating system instructions and user application instructions.

Cache/memory controller 645 may be configured to manage transfer of data between fabric 610 and one or more caches and/or memories. For example, cache/memory controller 645 may be coupled to an L3 cache, which may in turn be coupled to a system memory. In other embodiments, cache/memory controller 645 may be directly coupled to a memory. In some embodiments, cache/memory controller 645 may include one or more internal caches.

As used herein, the term "coupled to" may indicate one or more connections between elements, and a coupling may include intervening elements. For example, in FIG. 6, graphics unit 670 may be described as "coupled to" a memory through fabric 610 and cache/memory controller 645. In contrast, in the illustrated embodiment of FIG. 6, graphics unit 670 is "directly coupled" to fabric 610 because there are no intervening elements.

Graphics unit 670 may include one or more processors and/or one or more graphics processing units (GPU's). Graphics unit 670 may receive graphics-oriented instructions, such as OPENGL®, Metal, or DIRECT3D® instructions, for example. Graphics unit 670 may execute specialized GPU instructions or perform other operations based on the received graphics-oriented instructions. Graphics unit 670 may generally be configured to process large blocks of data in parallel and may build images in a frame buffer for output to a display. Graphics unit 670 may include transform, lighting, triangle, and/or rendering engines in one or more graphics processing pipelines. Graphics unit 670 may output pixel information for display images. Programmable shader 675, in various embodiments, may include highly parallel execution cores configured to execute graphics programs, which may include pixel tasks, vertex tasks, and compute tasks (which may or may not be graphics-related).

Display unit 665 may be configured to read data from a frame buffer and provide a stream of pixel values for display. Display unit 665 may be configured as a display pipeline in some embodiments. Additionally, display unit 665 may be configured to blend multiple frames to produce an output frame. Further, display unit 665 may include one or more interfaces (e.g., MIPI® or embedded display port (eDP)) for coupling to a user display (e.g., a touchscreen or an external display).

I/O bridge 650 may include various elements configured to implement: universal serial bus (USB) communications, security, audio, and/or low-power always-on functionality, for example. I/O bridge 650 may also include interfaces such as pulse-width modulation (PWM), general-purpose input/output (GPIO), serial peripheral interface (SPI), and/or inter-integrated circuit (I2C), for example. Various types of peripherals and devices may be coupled to device 600 via I/O bridge 650.

Example Computer-Readable Medium

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 7:
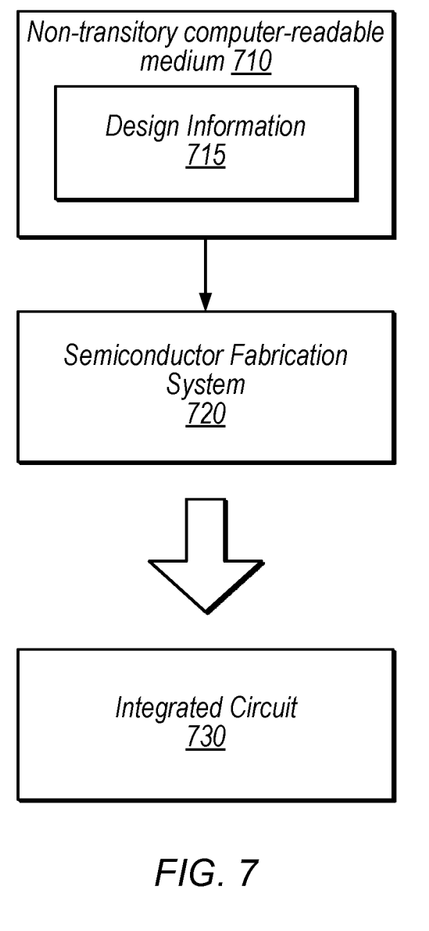
FIG. 7 is a block diagram illustrating an example computing device.

FIG. 7 is a block diagram illustrating an example non-transitory computer-readable storage medium that stores circuit design information, according to some embodiments. In the illustrated embodiment semiconductor fabrication system 720 is configured to process the design information 715 stored on non-transitory computer-readable medium 710 and fabricate integrated circuit 730 based on the design information 715.

Non-transitory computer-readable storage medium 710, may comprise any of various appropriate types of memory devices or storage devices. Non-transitory computer-readable storage medium 710 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 710 may include other types of non-transitory memory as well or combinations thereof. Non-transitory computer-readable storage medium 710 may include two or more memory mediums which may reside in different locations, e.g., in different computer systems that are connected over a network.

Design information 715 may be specified using any of various appropriate computer languages, including hardware description languages such as, without limitation: VHDL, Verilog, SystemC, SystemVerilog, RHDL, M, MyHDL, etc. Design information 715 may be usable by semiconductor fabrication system 720 to fabricate at least a portion of integrated circuit 730. The format of design information 715 may be recognized by at least one semiconductor fabrication system 720. In some embodiments, design information 715 may also include one or more cell libraries which specify the synthesis and/or layout of integrated circuit 730. In some embodiments, the design information is specified in whole or in part in the form of a netlist that specifies cell library elements and their connectivity. Design information 715, taken alone, may or may not include sufficient information for fabrication of a corresponding integrated circuit. For example, design information 715 may specify the circuit elements to be fabricated but not their physical layout. In this case, design information 715 may need to be combined with layout information to actually fabricate the specified circuitry.

Integrated circuit 730 may, in various embodiments, include one or more custom macrocells, such as memories, analog or mixed-signal circuits, and the like. In such cases, design information 715 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 720 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 720 may also be configured to perform various testing of fabricated circuits for correct operation.

In various embodiments, integrated circuit 730 is configured to operate according to a circuit design specified by design information 715, which may include performing any of the functionality described herein. For example, integrated circuit 730 may include any of various elements shown in FIG. 1, 2A, 3A, 3B, 4A, or 4B. Further, integrated circuit 730 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   pulse circuitry configured to generate a pulse signal in response to an active clock edge;
   latch circuitry configured to store a value of an input signal, wherein the input signal has a first voltage level;
   pull circuitry configured to drive, during the pulse signal, an output of the latch circuitry to match a logical value of the input signal at a second, different voltage level; and
   feedback circuitry configured to maintain the output of the latch circuitry at the second voltage level after the pulse signal.

2. The apparatus of claim 1, wherein the pull circuitry includes a transistor stack coupled between the output of the latch circuitry and a source voltage or reference voltage, wherein the transistor stack includes a first transistor controlled by the pulse signal and a second transistor controlled by the input signal.

3. The apparatus of claim 1, wherein the feedback circuitry includes one or more transistors configured to enable cross-coupled circuitry of the latch circuitry after the pulse signal.

4. The apparatus of claim 1, wherein the latch circuitry, the pull circuitry, and the feedback circuitry implement a flip-flop with voltage level shifting.

5. The apparatus of claim 1, wherein the latch circuitry, the pull circuitry, and the feedback circuitry implement a static to dynamic converter with voltage level shifting.

6. The apparatus of claim 5, further comprising one or more transistors configured to drive the output of the latch to a logical zero when the clock is low and disable at least a portion of the feedback circuitry when the clock is low.

7. The apparatus of claim 1, further comprising:
   circuitry configured to generate the input signal at the first voltage level, wherein the circuitry is configured to time borrow from the latch circuitry by changing the input signal after the active clock edge and during the pulse signal.

8. A method, comprising:
   generating, by pulse circuitry, a pulse signal in response to an active clock edge;
   driving, by pull circuitry during the pulse signal, an output of latch circuitry to match a logical value of an input signal, wherein the input signal has a first voltage level and the output has a second voltage level; and
   maintaining, by feedback circuitry, the output of the latch circuitry at the second voltage level after the pulse signal.

9. The method of claim 8, wherein the driving, by the pull circuitry, includes controlling a transistor using the pulse signal to pull a source voltage or a reference voltage to the output of the latch circuitry via a transistor controlled by the input signal.

10. The method of claim 8, wherein the maintaining by the feedback circuitry uses cross-coupled circuitry of the latch that is enabled by one or more transistors after the pulse signal.

11. The method of claim 8, wherein the generating, storing, driving, and maintaining implement flip-flop functionality with a voltage level shift.

12. The method of claim 8, wherein the generating, storing, driving, and maintaining implement static to dynamic converter functionality with a voltage level shift.

13. The method of claim 8, further comprising:
time borrowing from the latch circuitry, by circuitry that generates the input signal at the first voltage level, by changing the input signal after the active clock edge and during the pulse signal.

14. A non-transitory computer readable storage medium having stored thereon design information that specifies a design of at least a portion of a hardware integrated circuit in a format recognized by a semiconductor fabrication system that is configured to use the design information to produce the circuit according to the design, wherein the design information specifies that the circuit includes:
pulse circuitry configured to generate a pulse signal in response to an active clock edge;
latch circuitry configured to store a value of an input signal, wherein the input signal has a first voltage level;
pull circuitry configured to drive, during the pulse signal, an output of the latch circuitry to match a logical value of the input signal at a second, different voltage level; and
feedback circuitry configured to maintain the output of the latch circuitry at the second voltage level after the pulse signal.

15. The non-transitory computer readable storage medium of claim 14, wherein the pull circuitry includes a transistor stack coupled between the output of the latch circuitry and a source voltage or reference voltage, wherein the transistor stack includes a first transistor controlled by the pulse signal and a second transistor controlled by the input signal.

16. The non-transitory computer readable storage medium of claim 14, wherein the feedback circuitry includes one or more transistors configured to enable cross-coupled circuitry of the latch circuitry after the pulse signal.

17. The non-transitory computer readable storage medium of claim 14, wherein the latch circuitry, the pull circuitry, and the feedback circuitry implement a flip-flop with voltage level shifting.

18. The non-transitory computer readable storage medium of claim 14, wherein the latch circuitry, the pull circuitry, and the feedback circuitry implement a static to dynamic converter with level shifting.

19. The non-transitory computer readable storage medium of claim 18, wherein the design information further specifies that the circuit includes:
one or more transistors configured to drive the output of the latch to a logical zero when the clock is low and disable at least a portion of the feedback circuitry when the clock is low.

20. The non-transitory computer readable storage medium of claim 14, wherein the design information further specifies that the circuit includes:
upstream circuitry configured to generate the input signal at the first voltage level, wherein the upstream circuitry is configured to time borrow from the latch circuitry by changing the input signal after the active clock edge and during the pulse signal.

\* \* \* \* \*